(12) United States Patent
Furuya et al.

(10) Patent No.: US 9,330,948 B2
(45) Date of Patent: May 3, 2016

(54) HEATER UNIT, FAN FILTER UNIT, AND SUBSTRATE PROCESSING APPARATUS

(75) Inventors: Masaaki Furuya, Yokohama (JP);
Munenori Iwami, Yokohama (JP);
Takahiko Wakatsuki, Yokohama (JP);
Masanori Kondo, Yokohama (JP);
Katsuya Yamada, Tokyo-to (JP)

(73) Assignees: SHIBAURA MECHATRONICS CORPORATION, Yokohama-shi (JP);
KABUSHIKI KAISHA TOSHIBA, Tokyo (JP)

( * ) Notice: Subject to any disclaimer, the term of this patent is extended or adjusted under 35 U.S.C. 154(b) by 740 days.

(21) Appl. No.: 13/529,404

(22) Filed: Jun. 21, 2012

(65) Prior Publication Data
US 2012/0325797 A1 Dec. 27, 2012

(30) Foreign Application Priority Data

Jun. 21, 2011 (JP) ................. P2011-137060

(51) Int. Cl.
| | |
|---|---|
| *F27D 11/00* | (2006.01) |
| *H01L 21/67* | (2006.01) |
| *B01D 46/10* | (2006.01) |
| *B01D 46/42* | (2006.01) |
| *H05B 3/28* | (2006.01) |

(52) U.S. Cl.
CPC .......... *H01L 21/67103* (2013.01); *B01D 46/10* (2013.01); *B01D 46/4263* (2013.01); *H05B 3/283* (2013.01); *B01D 2273/30* (2013.01); *H05B 2203/022* (2013.01)

(58) Field of Classification Search
CPC .... H05B 3/283; H05B 3/008; H01L 21/6703; B01D 2273/30; B01D 2279/30; H05B 2203/22; F24H 3/0405
See application file for complete search history.

(56) References Cited

U.S. PATENT DOCUMENTS

| | | | |
|---|---|---|---|
| 4,044,221 A | 8/1977 | Kuhn | |
| 4,900,898 A | 2/1990 | Kling | |
| 2006/0289000 A1* | 12/2006 | Naylor | ............... 126/96 |
| 2007/0221652 A1* | 9/2007 | Cheng | .......... 219/448.11 |

FOREIGN PATENT DOCUMENTS

| | | |
|---|---|---|
| CN | 1835193 A | 9/2006 |
| JP | 10-214761 A | 8/1998 |

(Continued)

OTHER PUBLICATIONS

Combined Office Action and Search Report issued Aug. 25, 2014, in Chinese Patent Application No. 201210243147.4 with English translation of text of First Office Action and with English translation of category of cited documents.

(Continued)

*Primary Examiner* — Shawntina Fuqua
(74) *Attorney, Agent, or Firm* — Oblon, McClelland, Maier & Neustadt, L.L.P

(57) ABSTRACT

A heater unit according to an embodiment includes: a flat heater including a linear heating element arranged in a planar pattern; a first mesh body formed in a mesh pattern using a material with high heat conductivity and placed at least on one side of the flat heater facing the flat heater; and a second mesh body formed in a mesh pattern using a material with lower heat conductivity than that of the first mesh body and placed to face a surface of the first mesh body opposite to the surface of the first mesh body facing the flat heater.

17 Claims, 13 Drawing Sheets

(56) References Cited

FOREIGN PATENT DOCUMENTS

| | | |
|---|---|---|
| JP | 2005-537632 | 12/2005 |
| JP | 2006-261456 A | 9/2006 |
| JP | 2008-235302 | 10/2008 |
| JP | 4163716 B2 | 10/2008 |
| KR | 10-2005-0099447 A | 10/2005 |
| TW | I276771 | 8/2001 |
| TW | I312855 | 8/2009 |
| WO | WO 03/069654 A1 | 8/2003 |
| WO | WO 2004/083754 A1 | 9/2004 |

OTHER PUBLICATIONS

Combined Office Action and Search Report issued Nov. 26, 2014 in Taiwanese Patent Application No. 101119959 (with English translation).

Office Action issued Feb. 16, 2015 in Japanese Patent Application No. 2011-137060 (with English language translation).

Combined Chinese Office Action and Search Report issued Apr. 22, 2015 in Patent Application No. 201210243147.4 (with English Translation of Category of Cited Documents).

* cited by examiner

HEATER UNIT, FAN FILTER UNIT, AND SUBSTRATE PROCESSING APPARATUS

CROSS-REFERENCE TO THE RELATED APPLICATION

This application is based on and claims the benefit of priority from Japanese Patent Application No. 2011-137060, filed on Jun. 21, 2011; the entire contents of which are incorporated herein by reference.

FIELD

Embodiments relate to a heater unit, a fan filter unit including the heater unit, and a substrate processing apparatus including the fan filter unit.

BACKGROUND

In a substrate processing step for semiconductor wafers and liquid crystal substrates, the substrate processing needs to be performed in a substrate processing apparatus under an environment with dust reduced in order to prevent occurrence of defects at the substrate processing. Dust within the substrate processing apparatus is reduced by supplying the substrate processing apparatus with clean air from which dust is collected by a filter.

Moreover, in the substrate processing step, the temperature of the processing environment is increased to activate the processing reaction and increase the processing speed, so that the productivity is increased.

To this end, a hot air generator for generating hot air is provided separately from the substrate processing apparatus. The hot air generated by the hot air generator is supplied to the substrate processing apparatus, and dust contained in the hot air supplied to the substrate processing apparatus is collected using a filter. The hot air generator includes: a casing; a heater accommodated in the casing; and a fan supplying air into the casing. In addition, an air duct is connected between the hot air generator and the substrate processing unit, and a filter collecting dust is provide to the air duct on an entrance side of the substrate processing apparatus.

On the other hand, instead of such a hot air generator provided separately from a substrate processing apparatus, another type of known system configured to supply hot clean air into the substrate processing apparatus includes a fan filter unit including a fan, a heater, and a filter and being installed above the substrate processing apparatus.

The method in which the hot air generator and the substrate processing apparatus are provided separately from each other and the hot air generator generates and supplies hot air to the substrate processing apparatus through the air duct, however, requires a space to install the hot air generator. Accordingly, the whole system including the substrate processing apparatus and the hot air generator requires a large space for installation.

In the case where the hot air generator is connected to plural substrate processing apparatuses, the lengths of the air ducts connecting the hot air generator and the substrate processing apparatuses differ among the substrate processing apparatuses in some cases. Such a difference in length among the air ducts easily causes temperature variations in the hot air supplied to the substrate processing apparatuses. If the hot air supplied to the substrate processing apparatuses has temperature variations, semiconductor wafers or the like processed by the substrate processing apparatuses vary in quality.

On the other hand, if the fan filter unit including the heater is used, heat of the heater is easily transmitted to the filter. Since the heat-resistant temperature of the filter is about 60° C., the heat transmission of the heater to the filter causes degradation of the filter due to deformation or the like, and therefore lowers the dust collecting performance of the filter.

DETAILED DESCRIPTION

According to an embodiment, a heater unit includes: a flat heater including a linear heating element arranged in a planar pattern; a first mesh body formed in a mesh pattern using a material with high heat conductivity and is placed at least on one side of the flat heater facing the flat heater; and a second mesh body formed in a mesh pattern using a material with lower heat conductivity than that of the first mesh body and placed to face a surface of the first mesh body opposite to the surface of the first mesh body facing the flat heater.

According to another embodiment, a fan filter unit includes: a fan unit including a fan configured to blow air; a filter unit including a filter configured to collect dust within the blown air; and the heater unit according to the aforementioned embodiment which is provided between the fan unit and filter unit in such a manner that a surface of the heater unit on the side where the first and second mesh bodies are provided faces the filter unit.

According to still another embodiment, a substrate processing apparatus includes: a casing provided with a mechanism for substrate processing inside; and the fan filter unit according to the aforementioned another embodiment which is attached to the casing and supplies air into the casing.

Various Embodiments will be described hereinafter with reference to the accompanying drawings.

First Embodiment

A description is given of a substrate processing apparatus 1 according to a first embodiment of the present invention based on FIGS. 1 to 7.

Figure 1:
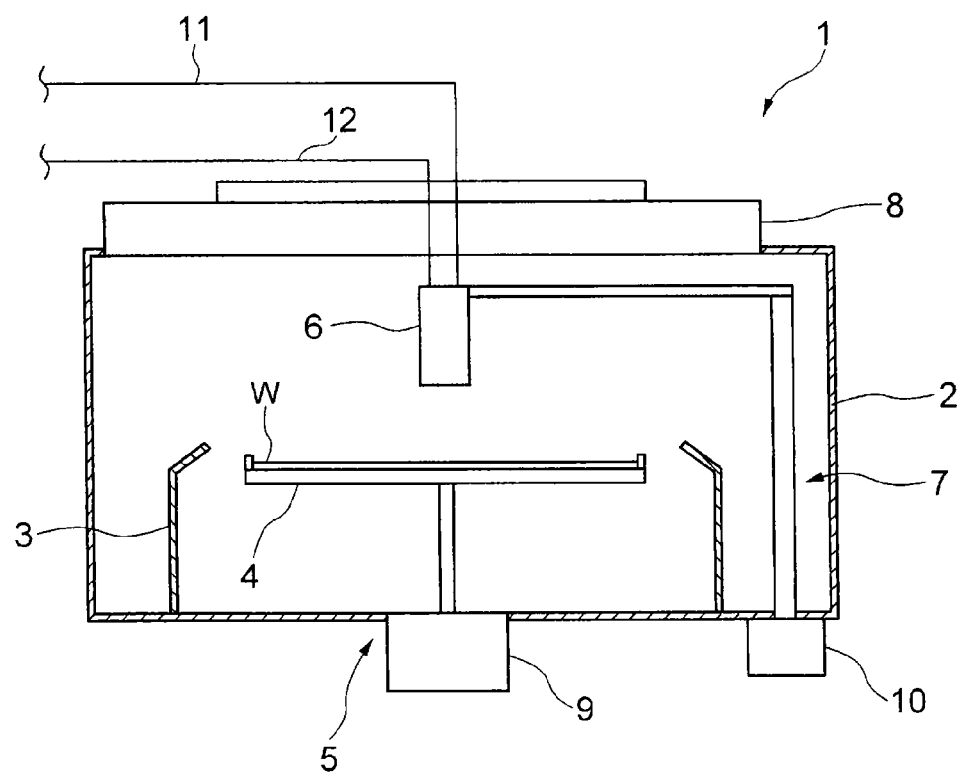
FIG. 1 is a schematic view showing a configuration of a substrate processing apparatus according to a first embodiment of the present invention.

As shown in FIG. 1, the substrate processing apparatus 1 includes: a processing box 2 as a casing which is provided with a mechanism for substrate processing inside; a cup 3 provided within the processing box 2; a holding table 4 which is provided within the cup 3 and holds a substrate W horizontally positioned; a rotation mechanism 5 rotating the holding table 4 in a horizontal plane; a supply nozzle 6 supplying processing liquid from above onto the substrate W placed on the holding table 4; a movement mechanism moving the supply nozzle 6 in a horizontal direction along the surface of the substrate W; and a fan filter unit 8 which is provided for a ceiling part of the processing box 2. The rotation mechanism 5 includes a motor 9 rotating the holding table 4, and the movement mechanism 7 includes a motor 10 moving the supply nozzle 6 in the horizontal direction. The supply nozzle 6 is connected to an end of each of tubes 11 and 12. The other end of the tube 11 is connected to a processing liquid supplier (not shown) supplying the processing liquid, and the other end of the tube 12 is connected to a gas supplier (not shown) supplying gas. The cup 3 functions to receive the processing liquid scattering from the rotating substrate W.

Figure 2:
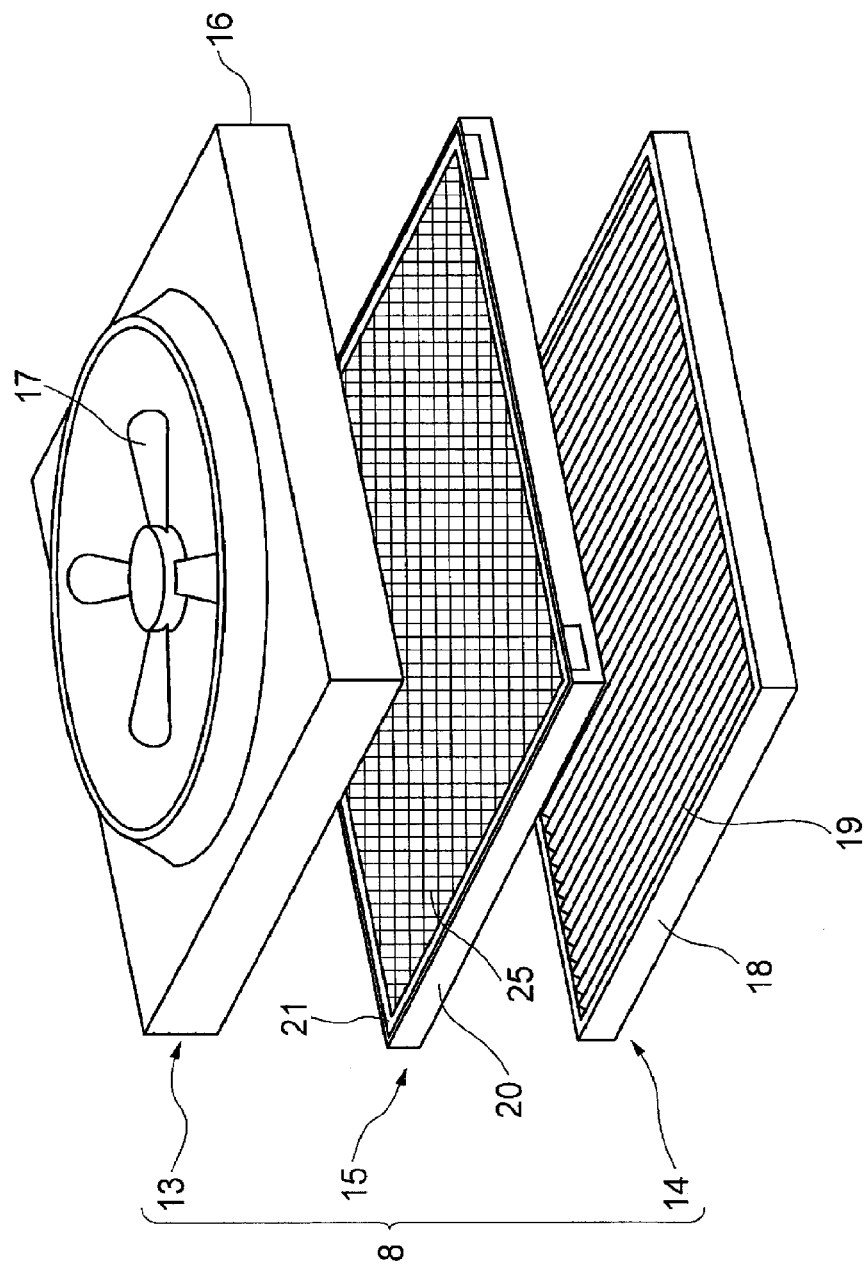
FIG. 2 is an exploded perspective view showing a fan filter unit.

As shown in FIG. 2, the fan filter unit 8 includes: a fan unit 13, a filter unit 14, and a heater unit 15 provided between the fan unit 13 and filter unit 14.

The fan unit 13 includes a case 16 and a propeller fan 17 as a fan accommodated in the case 16. The case 16 extends so as to cover the peripheries of the heater unit 15 and filter unit 14.

The filter unit 14 includes a filter holding frame 18, which holds a filter 19 folded in an accordion fashion.

The heater unit 15 includes a heater frame 20 and a heater frame lid 21. The heater frame 20 and heater frame lid 21 hold the constituent components of the heater unit 15.

Figure 3:
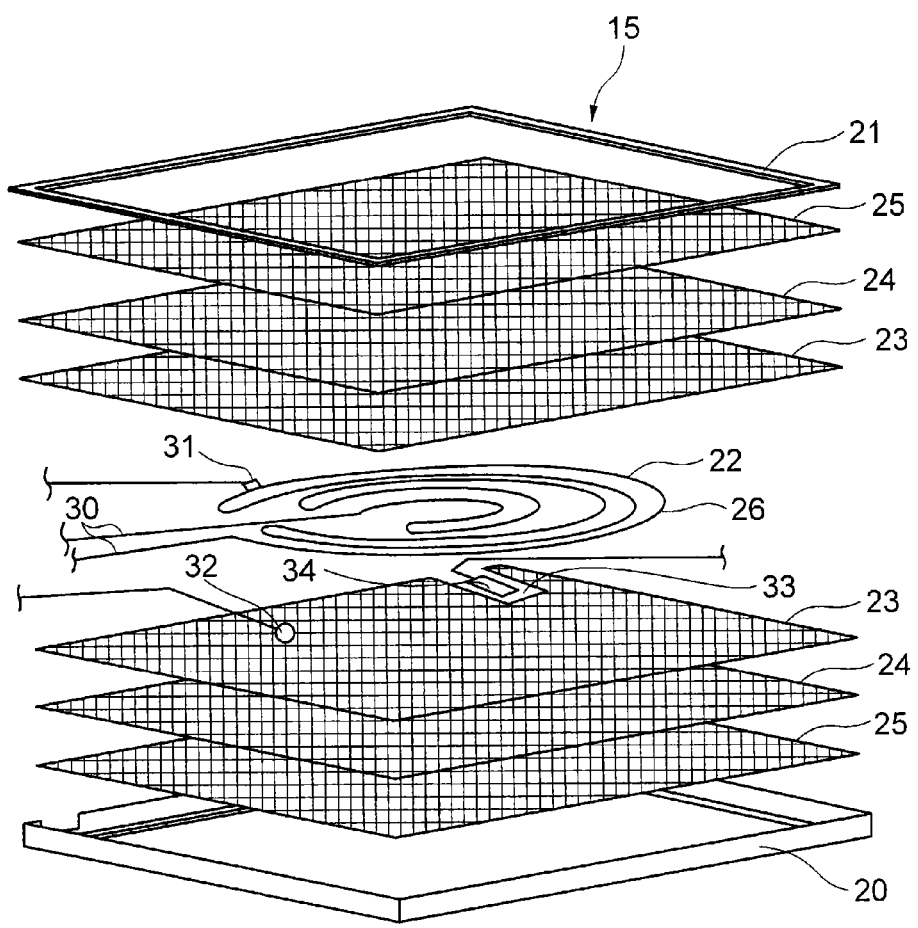
FIG. 3 is an exploded perspective view showing a heater unit.
Figure 4:
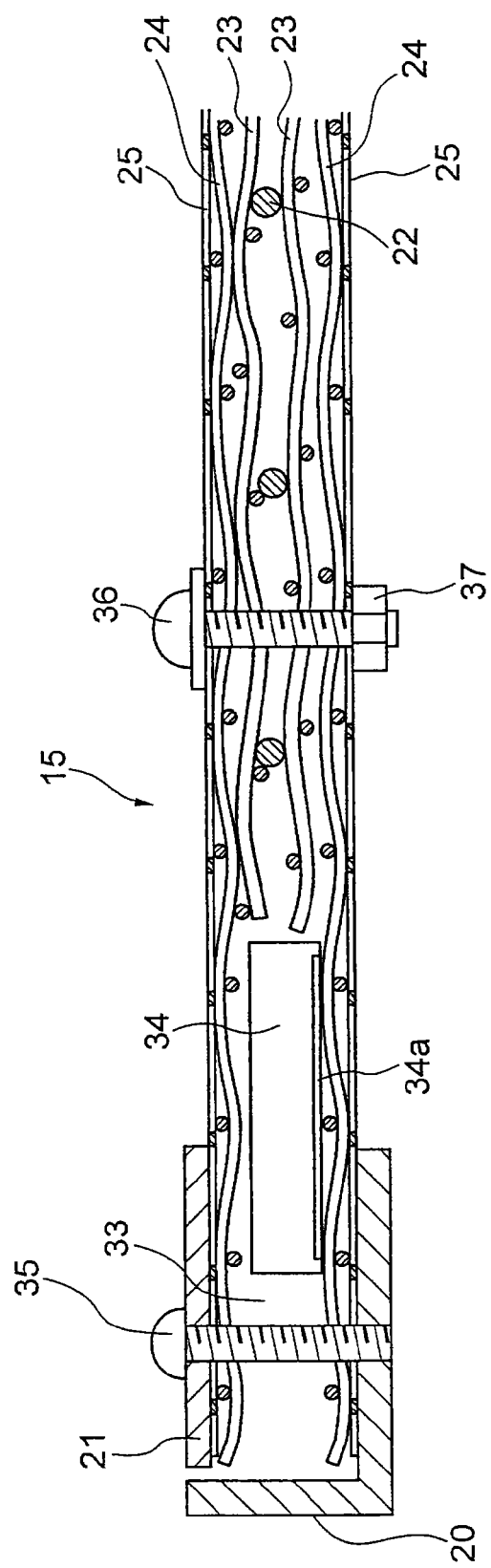
FIG. 4 is a cross-sectional view showing a part of the hater unit.

As shown in FIGS. 3 and 4, the heater unit 15 includes a flat heater 22, a pair of aluminum meshes 23 as a first mesh body, a pair of stainless meshes 24 as a primary second mesh body, and a pair of glass fiber meshes 25 as a secondary second mesh body. The pair of aluminum meshes 23 are formed in a mesh pattern using aluminum which is a material with high heat conductivity. The pair of stainless meshes 24 are formed in a mesh pattern using stainless which has a low heat conductivity of about 1/10 of that of aluminum. The pair of glass fiber meshes 25 are formed in a mesh pattern using glass fiber which has a very low heat conductivity of about 1/200 of that of aluminum.

Figure 5A:
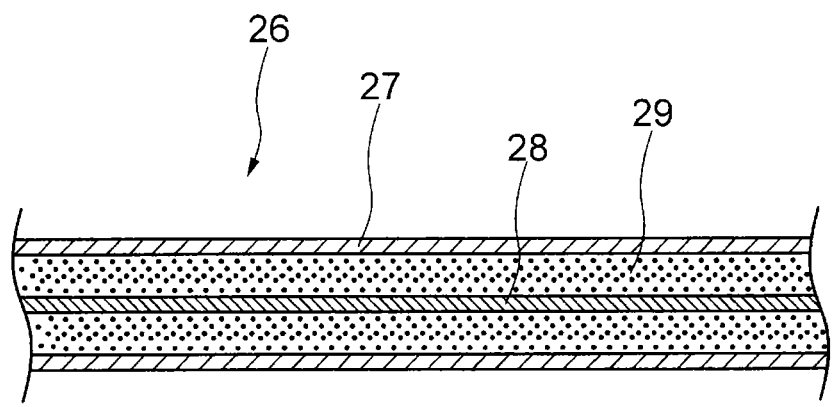
FIG. 5A is a longitudinal sectional side view showing a sheathed heater.
Figure 5B:
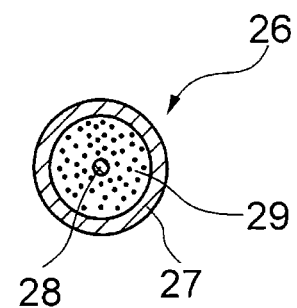
FIG. 5B is a longitudinal sectional front view showing the sheathed heater.

The flat heater 22 is formed in a planar pattern by arranging a linear heating element, for example, a sheathed heater 26, in a coil form in which adjacent parts of the sheathed heater 26 are spaced out at regular intervals. As shown in FIGS. 5A and 5B, the sheathed heater 26 includes a heating wire 28 within a pipe 27 made of metal such as stainless; and an insulator 29 filled between the pipe 27 and heating wire 28. Again in FIG. 3, both ends of the flat heater 22 are connected to individual ends of extension wires 30 for electrical conduction. On the surface of the flat heater 22, a heater temperature measurement thermocouple 31 as a first temperature measurement unit configured to measure the temperature of the flat heater 22 is attached.

The pair of aluminum meshes 23 are positioned on both sides of the flat heater 22 so as to sandwich the flat heater 22. One side of each aluminum mesh 23 is in contact with the flat heater 22 at plural points (see FIG. 4). On the surface of one of the aluminum meshes 23, a mesh temperature measurement thermocouple 32 as a second temperature measurement unit for measuring the temperature of the aluminum mesh 23 is attached. Moreover, each aluminum mesh 23 includes a notch portion 33 in a part of the periphery, and a thermostat 34 is placed within the notch portion 33.

The pair of stainless meshes 24 are positioned so as to sandwich the flat heater 22 and the pair of aluminum meshes 23. Each of the stainless meshes 24 faces the surface of the corresponding aluminum mesh 23 opposite to the surface of the aluminum mesh 23 in contact with the flat heater 22. One of the stainless meshes 24 abuts on a thermosensitive surface 34a of the thermostat 34 having high heat conductivity. The thermostat 34 monitors an increase in temperature of the stainless mesh 24.

The pair of glass fiber meshes 25 are positioned so as to sandwich the flat heater 22, the pair of aluminum meshes 23, and the pair of stainless meshes 24 in such a way that each glass fiber mesh 25 faces the surface of the corresponding stainless mesh 24 opposite to the surface of the stainless mesh 24 facing the corresponding aluminum mesh 23.

The peripheries of the aluminum meshes 23, stainless meshes 24, and glass fiber meshes 25 are sandwiched by the heater frame 20 and heater frame lid 21 as shown in FIG. 4 and are fixed to the heater frame 20 and heater frame lid 21 by plural fixing screws 35. Furthermore, fixing screws 36 penetrate through mesh part of the aluminum meshes 23, stainless meshes 24, and glass fiber 25. The end of each fixing screw 36 is screwed with a nut 37 to fasten the meshes 23 to 25.

The aluminum meshes 23 and glass fiber meshes 25 are flexible meshes with low rigidity. On the other hand, the stainless meshes 24 are meshes with high rigidity. By stacking and fixing the aluminum meshes 23, stainless meshes 24, and glass fiber meshes 25 on each other using the fixing screws 35 and 36, the stainless meshes 24 function as reinforcement members to prevent the aluminum meshes 23 and glass fiber meshes 25 from bending.

Figure 6:
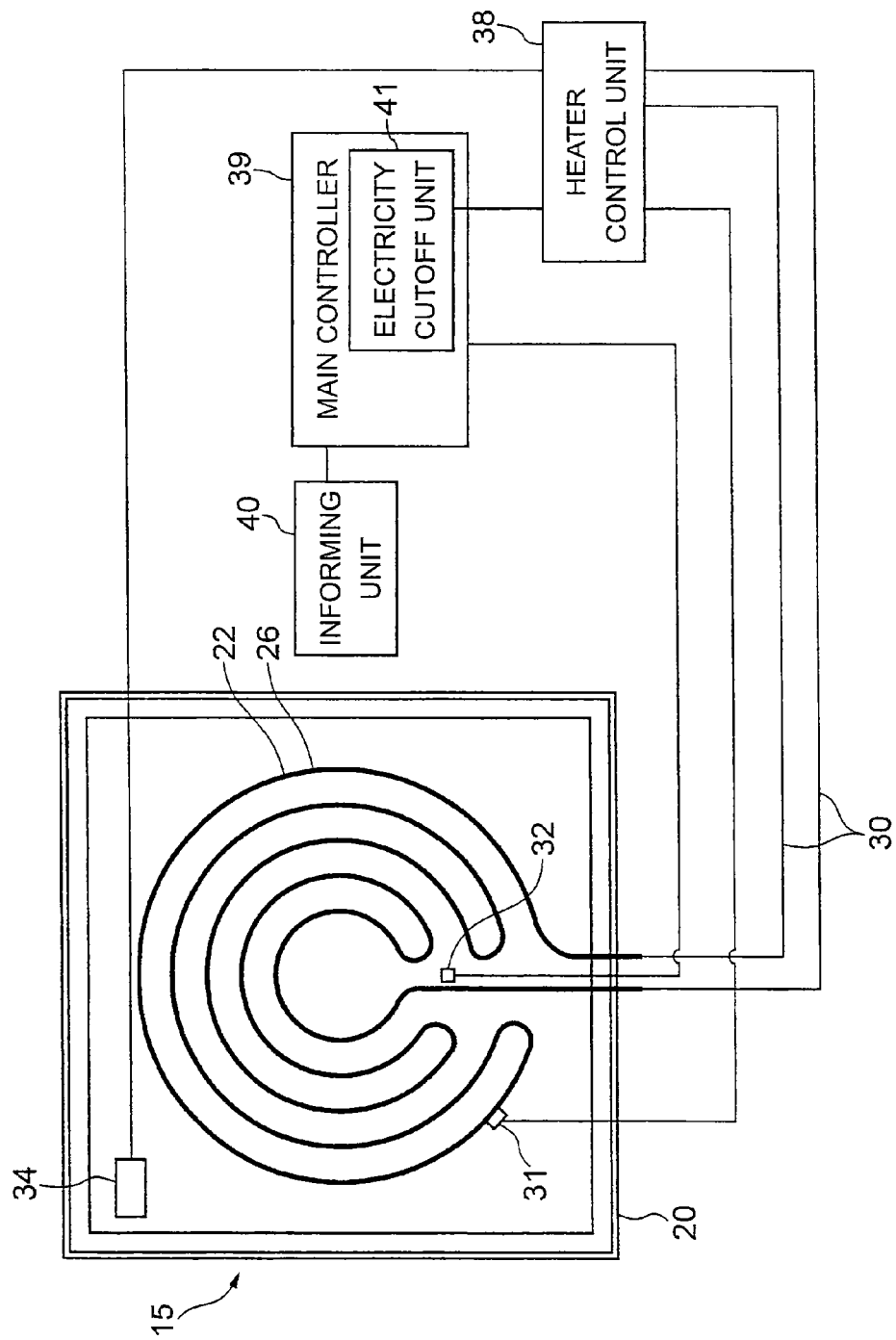
FIG. 6 is a schematic view showing an electrical connecting structure of the heater unit.

Next, a description is given of an electrical connecting structure of the heater unit 15 based on FIG. 6.

The ends of the lead wires 30 for electrical conduction, whose other ends are connected to both ends of the flat heater 22, are connected to a heater control unit 38 as a temperature controller configured to control the electrical conduction to the flat heater 22. Moreover, the heater control unit 38 is connected to the heater temperature measurement thermocouple 31 for measuring the flat heater 22. The heater control unit 38 controls the electrical conduction to the flat heater 22 so that the measurement value of the heater temperature measurement thermocouple 31 becomes equal to a setting value.

The mesh temperature measurement thermocouple 32 for measuring the temperature of the aluminum mesh 23 is connected to a main controller 39 configured to control the entire fan filter unit 8. The main controller 39 is connected to the heater control unit 38 and an informing unit 40. The informing unit 40 issues an alarm when the measurement value of the mesh temperature measurement thermocouple 32 reaches the setting value or above. Moreover, the main controller 39 includes an electricity cutoff unit 41. The electricity cutoff unit 41 outputs to the heater control unit 38 a signal to cut off electricity to the flat heater 22 when the measurement value of the mesh temperature measurement thermocouple 32 reaches the setting value or above.

The thermostat 34 is connected to the heater control unit 38. The thermostat 34 is provided with an electrical contact (not shown) inside, and the electrical contact is turned off when the measurement value of the temperature of the stainless mesh 24 reaches the setting value or above. When the electrical contact of the thermostat 34 is turned off, the electricity to the flat heater 22 is cut off.

Figure 7:
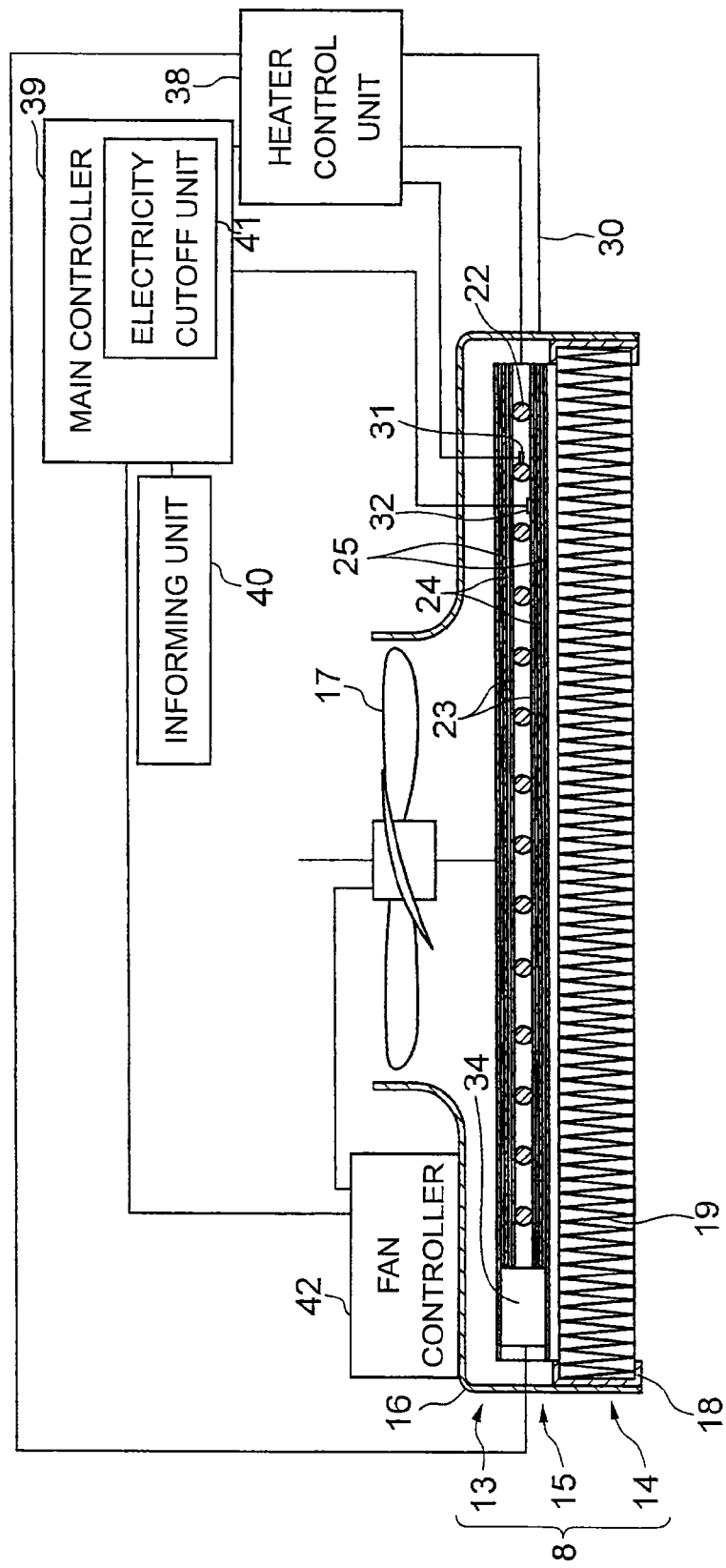
FIG. 7 is a schematic view showing an electrical connecting structure of the fan heater unit.

Next, a description is given of an electrical connecting structure of the fan filter unit 8 including the heater unit 15 based on FIG. 7. The part described in FIG. 6 is omitted.

The fan unit 13 includes a fan controller 42 configured to control rotation of the propeller fan 17. The fan controller 42 is connected to the main controller 39. The fan controller 42 outputs, to the main controller 39, a signal to inform the rotating state of the propeller fan 17. For example, the signal is outputted when the rotating state of the propeller fan 17 is abnormal. The main controller 39 outputs, to the fan controller 42, a signal to control the air volume of the propeller fan 17. For example, if the electricity to the flat heater 22 is cut off, the main controller 39 outputs to the fan controller 42, a signal to stop rotation of the propeller fan 17 after a predetermined period of time elapses from the electricity cutoff or after the measurement value of the mesh temperature measurement thermocouple 32 falls to the setting value or below.

In such a configuration, inside the processing box 2 of the substrate processing apparatus 1, processing liquid is supplied from the supply nozzle 6 to a substrate W on the holding table 4 for substrate processing. The processing box 2 is supplied with air cleaned and heated by the fan filter unit 8. Accordingly, the inside of the processing box 2 has an environment not containing dust, thus preventing occurrence of defects at substrate processing and the like due to dust in the air. Furthermore, heating the air supplied into the processing box 2 can accelerate the substrate processing in the processing box 2, thus increasing the productivity.

Next, a description is given of heating of air supplied into the processing box 2. At the substrate processing, the flat heater 22 and propeller fan 17 are energized with electricity. By the electrical energization of the flat heater 22, the flat heater 22 generates heat, and the generated heat is transferred to the aluminum meshes 23, which are placed in contact with the flat heater 22 and are made of aluminum with high heat conductivity. The temperature of the flat heater 22 and aluminum meshes 23 therefore increases. On the other hand, the propeller fan 17 is energized with electricity to rotate. With the rotation of the propeller fan 17, air is blown toward the flat heater 22 and aluminum meshes 23. The supplied air is heated when passing through the flat heater 22 and aluminum meshes 23. The heated air is supplied to the processing box 2 through the filter 19.

Herein, the flat heater 22 is formed in a planar pattern by arranging the linear sheathed heater 26 in a coil form. The flat heater 22 is in contact with the aluminum meshes 23 having high heat conductivity to heat the aluminum meshes 23 uniformly in the entire region of the heater unit 15. Accordingly, the air passing through the heater unit 15 is heated by the heat from the aluminum meshes 23 substantially uniformly in the entire region of the heater unit 15. The air supplied through the filter 19 into the processing box 2 has uniform temperature at each point of the processing box 2. It is therefore possible to stabilize the substrate processing performance within the processing box 2 and stabilize the quality of the processed substrates W.

The heat of the flat heater 22 is well transferred to the aluminum meshes 23 with high heat conductivity. Accordingly, even if the flat heater 22 unevenly generates heat, the aluminum meshes 23 are uniformly heated, and the air passing through the heater unit 15 can be therefore uniformly heated.

In the heater unit 15, the flat heater 22 and the pair of aluminum meshes 23 become hot. The air passing through the heater unit 15 is heated three times by the flat heater 22 and the pair of aluminum meshes 23. Accordingly, even if the flat heater 22 is heated to relatively low temperature, heating of the air passing through the heater unit 15 can be promoted. It is therefore possible to reduce the amount of electricity to the flat heater 22 for energy saving while heating the air passing through the heater unit 15 efficiently.

On the other hand, the stainless meshes 24 are positioned so as to sandwich the flat heater 22 and the pair of aluminum meshes 23. The stainless meshes 24 are made of stainless, which has a low heat conductivity of about $\frac{1}{10}$ of that of aluminum. Accordingly, even if the aluminum meshes 23 are in contact with the stainless meshes 24, heat transfer from the aluminum meshes 23 to the stainless meshes 24 is hindered. The glass fiber meshes 25 are positioned so as to further sandwich the pair of stainless meshes 24. The glass fiber meshes 25 are made of glass fiber, which has a low heat conductivity of about $\frac{1}{200}$ of that of aluminum. Accordingly, provision of such stainless meshes 24 and glass fiber meshes 25 can hinder transfer of heat generated at the flat heater 22 to the filter 19 which is a part placed around the heater unit 15. This prevents deformation, degradation, or the like of the filter 19 from lowering the dust collecting performance.

Having a structure including the flat heater 22 formed by arranging the linear sheathed heater 26 in a coil form; and the aluminum meshes 23, stainless meshes 24, and glass fiber meshes 25 which are mesh materials, the heater unit 15 has such low resistance to the air blown by the propeller fan 17 that the air blown by the propeller fan 17 can smoothly pass through the heater unit 15. This can prevent the situation where the blown air stays locally in the heater unit 15 and thereby is heated locally, or the situation where the temperature within the processing box 2 locally increases to make unstable the substrate processing performance within the processing box 2.

Next, a description is given of temperature control of the heater unit 15. The heater temperature measurement thermocouple 31 for measuring the temperature of the flat heater 22 is attached to the surface of the flat heater 22. This heater temperature measurement thermocouple 31 is connected to the heater control unit 38. The heater control unit 38 controls the electrical conduction to the flat heater 22 so that the measurement value of the heater temperature measurement thermocouple 31 is equal to a setting value. Accordingly, the temperature of the flat heater 22 is maintained at the setting value, and thus the temperature of the air supplied into the processing box 2 is maintained at the setting value.

Moreover, the mesh temperature measurement thermocouple 32 measuring the temperature of one of the aluminum meshes 23 is attached to the surface of the aluminum mesh 23. The mesh temperature measurement thermocouple 32 is connected to the main controller 39. The main controller 39 is connected to the informing unit 40 which issues an alarm when the measurement value of the mesh temperature thermocouple 32 reaches the setting value or above. Accordingly, operators of the substrate processing operation can be notified by the alarm issued by the informing unit 40 that the temperature of the aluminum mesh 23 has increased to the setting value or above and then can take necessary measures. Furthermore, if the measurement value of the mesh temperature measurement thermocouple 32 reaches the setting value or above, the signal to cut off the electricity to the flat heater 22 is outputted from the electricity cutoff unit 41 of the main controller 39 to the heater control unit 38, and then the electricity to the flat heater 22 is cut off. This can prevent the situation where the substrate processing operation continues with the temperature of the aluminum mesh 23 kept at the setting value or above.

Moreover, the thermostat 34 for measuring the temperature of one of the stainless meshes 24 is provided. When the temperature of the stainless mesh 24 increases to the setting value or above, the electrical contact within the thermostat 34 is turned off. If the electrical contact is turned off, the electricity to the flat heater 22 is cut off. This can prevent the situation where the substrate processing operation continues with the temperature of the stainless mesh 24 kept at the setting value or above. By providing the thermostat 24, the electricity to the flat heater 22 can be automatically cut off when the temperature of the stainless mesh 24 increases to the setting value or above especially if the electricity to the flat heater 22 cannot be cut off by software because of some trouble in a device operated by software. The safety of the substrate processing apparatus 1 can be therefore enhanced.

In the description of the first embodiment, the flat heater 22 is in contact with the aluminum meshes 23. However, the flat heater 22 is not necessarily in contact with the aluminum meshes 23 and may be placed in the vicinity of the aluminum meshes 23 so as to face the same in parallel. Even if the flat heater 22 is arranged in the vicinity of the aluminum meshes 23 so as to face the same in parallel without being in contact with the same, the aluminum meshes 23 with high heat conductivity is sufficiently heated by heat from the flat heater 22.

Moreover, in the example described in the first embodiment, the first and second mesh members are the aluminum meshes 23 and stainless meshes 24 formed of linear materials netted. Herein, the mesh members are not limited to these and may be each formed of a plate material with plural holes punched out.

In the example described in the first embodiment, the aluminum meshes 23, stainless meshes 24, and glass-fiber meshes 25 are arranged on both sides of the flat heater 22. These meshes 23 to 25 may be placed on one side of the flat heater 22 which faces the filter unit 14.

In the example described in the first embodiment, the stainless meshes 24 and glass-fiber meshes 25 are provided as the second mesh body. However, the heater unit 15 may be configured to include either the stainless meshes 24 or glass fiber meshes 25.

The example described in the first embodiment includes: the informing unit 40 issuing an alarm when the measurement value of the mesh temperature measurement thermocouple 32 increases to the setting value or above; and the electricity cutoff unit 41 outputting to the heater control unit 38 the signal to cut off the electricity to the flat heater 22. However, the substrate processing apparatus 1 may be configured to include either the informing unit 40 or the electricity cutoff unit 41.

In the first embodiment, the heater control unit 38 and main controller 39 are separated but may be integrated into one controller.

Moreover, the mesh temperature thermocouple 32 is configured to measure the temperature of one of the aluminum meshes 23. However, the mesh temperature measurement thermocouple 32 may be attached to a different place of the surface of the sheathed heater 26 from the heater temperature measurement thermocouple 31 to measure the surface temperature of the sheathed heater 26.

As for the position where the thermostat 34 is installed, in the example of the first embodiment, the thermostat 34 is installed at the edge of the flat heater 22. The installation position of the thermostat 34 is not particularly limited and may be at the central part of the flat heater 22, for example.

The thermostat 34 only needs to have a function of cutting off the electricity to the flat heater 22 when the temperature at the place where the thermostat 34 is installed increases to the setting value or higher. The predetermined temperature to cut off electricity to the flat heater 22 (electricity cutoff temperature) can be arbitrarily set according to the installation position of the thermostat 34. Moreover, in the case of using plural thermostats to detect increases in temperature at plural places, the thermostats are connected in series to form such a circuit that the electricity to the flat heater 22 can be cut off when any one of the thermostats reaches the electricity cutoff temperature.

Second Embodiment

Figure 8:
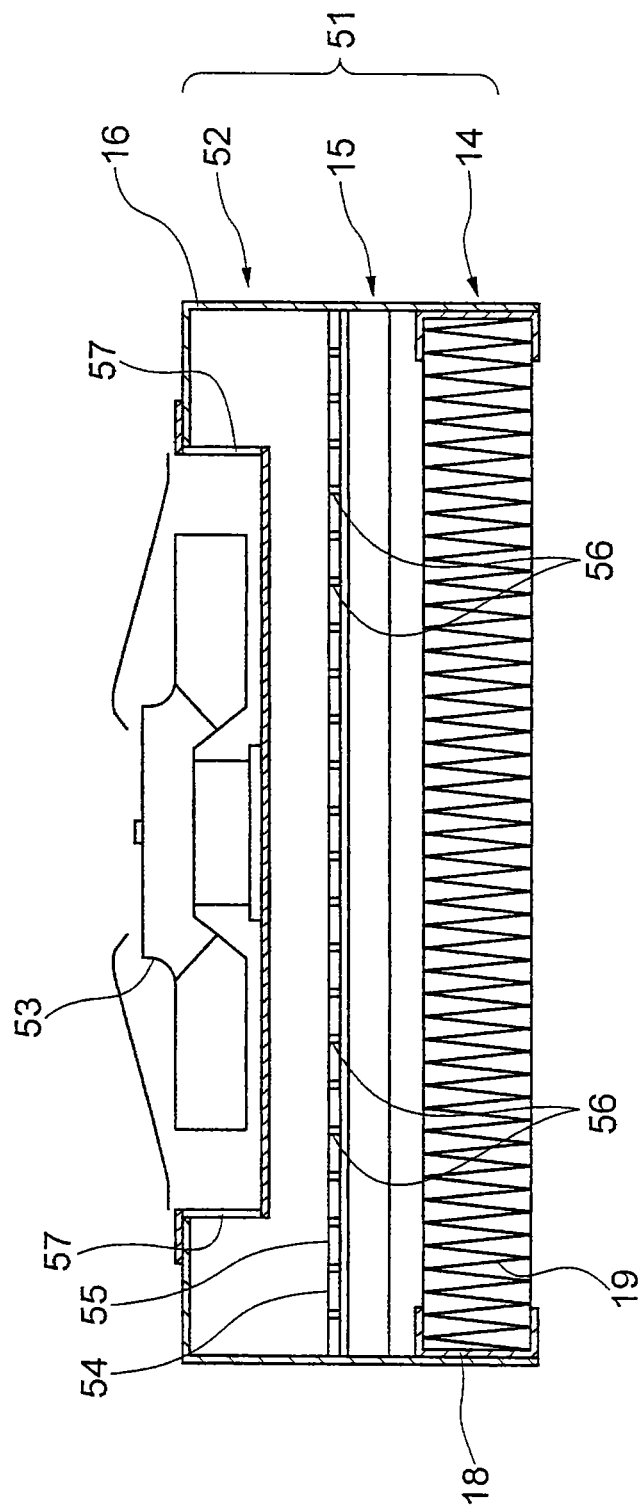
FIG. 8 is a cross-sectional view showing a fan filter unit according to a second embodiment of the present invention.

A description is given of a fan filter unit 51 according to a second embodiment of the present invention based on FIG. 8. In the second embodiment and other embodiment described below, the constituent components same as those of the above described embodiment are given the same reference numerals, and overlapping description is omitted.

The basic configuration of the fan filter unit 51 according to the second embodiment is the same as that of the fan filter unit 8 shown in FIGS. 2 and 7. The fan filter unit 51 includes a fan unit 52, the filter unit 14, and the heater unit 15.

The fan unit 52 of the second embodiment differs from the fan unit 13 of the first embodiment in that a sirocco fan 53 is used instead of the propeller fan 17 and that a regulator plate 54 as a regulator configured to homogenize the flow rate and direction of the air passing through the heater unit 15 is provided upstream of the heater unit 15 in the air blowing direction of the air blown by the sirocco fan 53. The regulator plate 54 includes a plate 55 with plural holes 56 bored.

In such a configuration, by driving the sirocco fan 53, air outside the case 16 is sucked into the sirocco fan 53, and the sucked air is blown out through openings 57 formed in the circumference of the sirocco fan 53. The air blown out from the openings 57 once stays in a space defined by the case 16 of the sirocco fan 53 and the regulator plate 54 to increase in pressure, and then is blown out through the holes 56 toward the heater unit 15. The air blown out from the holes 56 passes through the heater unit 15 with the flow rate and direction homogenized.

The air passing through the heater unit 15 is therefore uniformly heated and evenly passes through the filter 19. The temperature within the processing box 2 supplied with the air passing through the filter 19 is equalized at each point of the processing box 2. This can stabilize the substrate processing performance in the processing box 2 and therefore stabilize the quality of the processed substrates W.

Third Embodiment

Figure 9:
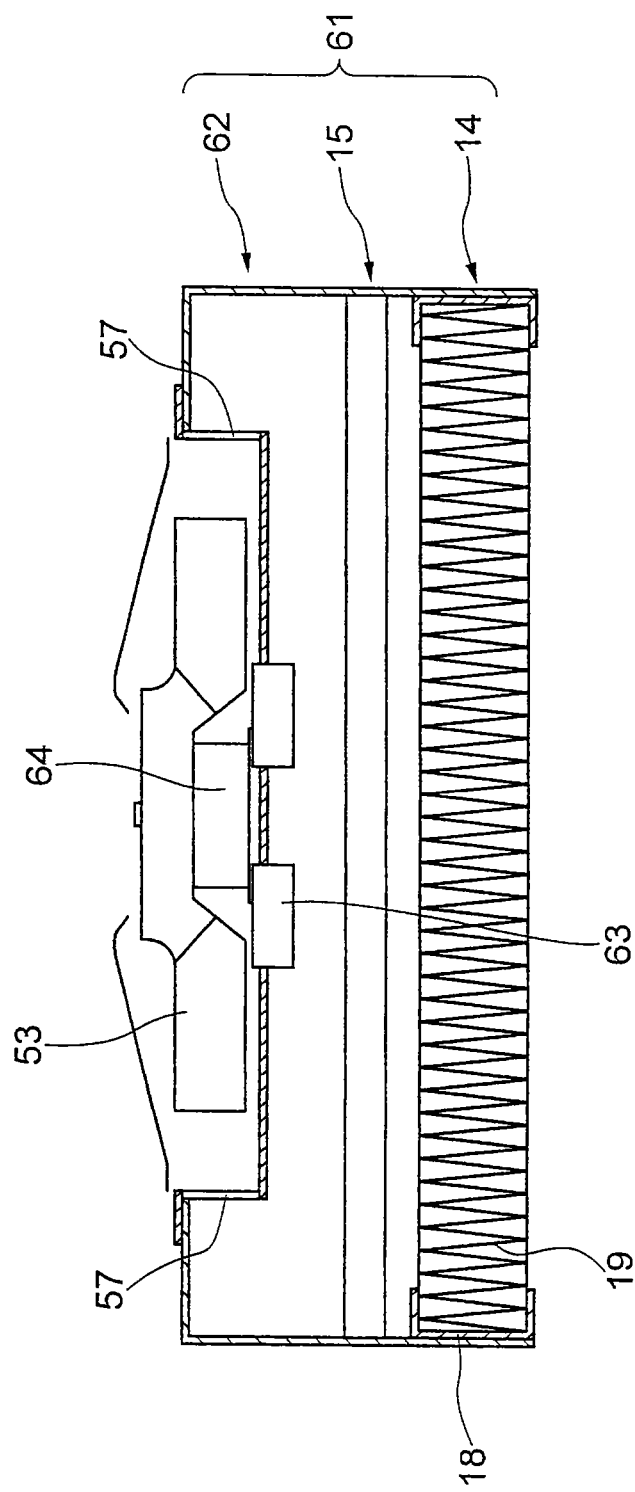
FIG. 9 is a cross-sectional view showing a fan filter unit according to a third embodiment of the present invention.

A description is given of a fan filter unit 61 according to a third embodiment of the present invention based on FIG. 9.

The basic configuration of the fan filter unit 61 according to the third embodiment is the same as that of the fan filter unit 51 shown in FIG. 8. The fan filter unit 61 includes a fan unit 62, the filter unit 14, and the heater unit 15. The fan unit 62 differs from the fan unit 52 in that the fan unit 62 includes a propeller fan 63 as the regulator while the fan unit 52 includes the regulator plate 54 as the regulator. The propeller fan 63 is placed between the sirocco fan 53 and heater unit 15 at the center side of the sirocco fan 53. The propeller fan 63 and the sirocco fan 53 share a motor 64.

In such a configuration, the air blown toward the heater unit 15 by the sirocco fan 53 is reduced in amount toward the central side of the sirocco fan 53. Specifically, with a low flow rate, the air heated by the heater unit 15 stays under the sirocco fan 53 or rises from the heater unit 15 in some cases. Accordingly, the propeller fan 63 is provided at the central side of the sirocco fan 53. The propeller fan 63 blows the heated air at the central side of the sirocco fan 53 toward the heater unit 15 or mixed the heated air with the unheated air at the peripheral part.

The air passing through the heater unit 15 is therefore uniformly heated, and the temperature within the processing box 2 supplied with the air passing through the filter 19 is equalized at each point. This can stabilize the substrate processing performance in the processing box 2 and therefore stabilize the quality of the processed substrates W.

Here, both the regulator plate 54 described in the second embodiment and the propeller fan 63 described in the third embodiment may be provided as the regulator.

Fourth Embodiment

Figure 10:
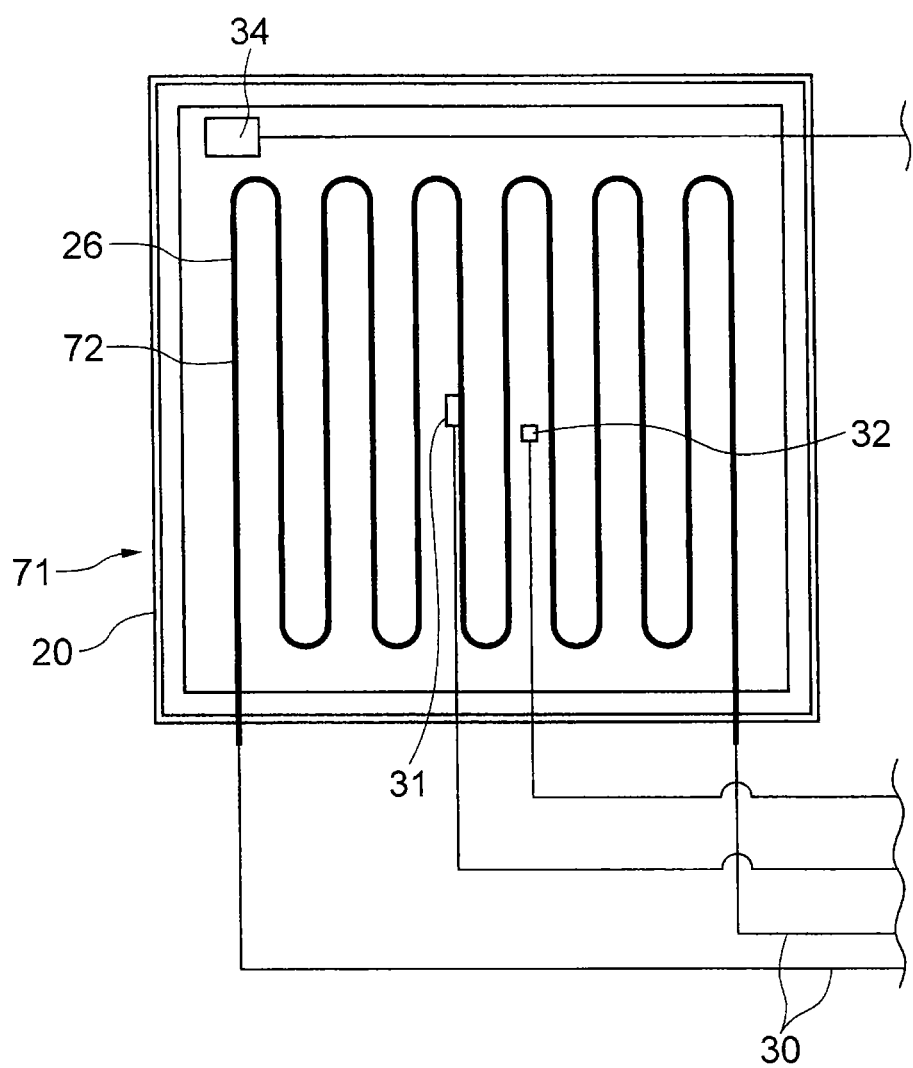
FIG. 10 is a plan view showing a flat heater according to a fourth embodiment of the present invention.

A description is given of a heater unit 71 according to a fourth embodiment of the present invention based on FIG. 10. The basic structure of the heater unit 71 is the same as the heater unit 15 shown in FIG. 6. The heater unit 71 differs from the heater unit 15 in that the heater unit 71 includes a flat heater 72 including the sheathed heater 26 formed in a planar pattern by folding a sheathed heater 26 back and forth, while the heater unit 15 includes the flat heater 22 formed in the planar pattern by arranging the sheathed heater 26 in the coil form.

In the flat heater 72, the pipe 27 (see FIGS. 5A and 5B) is arranged so that adjacent parts of the pipe 27 can be spaced out substantially at regular intervals.

In such a configuration, the flat heater 72 is formed in a planar pattern by folding the linear sheathed heater 26 back and forth. Accordingly, the air passing through the heater unit 71 is substantially uniformly heated in the entire area of the heater unit 71, and the temperature of the air supplied into the processing box 2 (see FIG. 1) through the filter 19 (see FIG. 7) can be equalized in the processing box 2. This can stabilize the substrate processing performance in the processing box 2 and therefore stabilize the quality of the processed substrates W.

Other Embodiments

Figure 11:
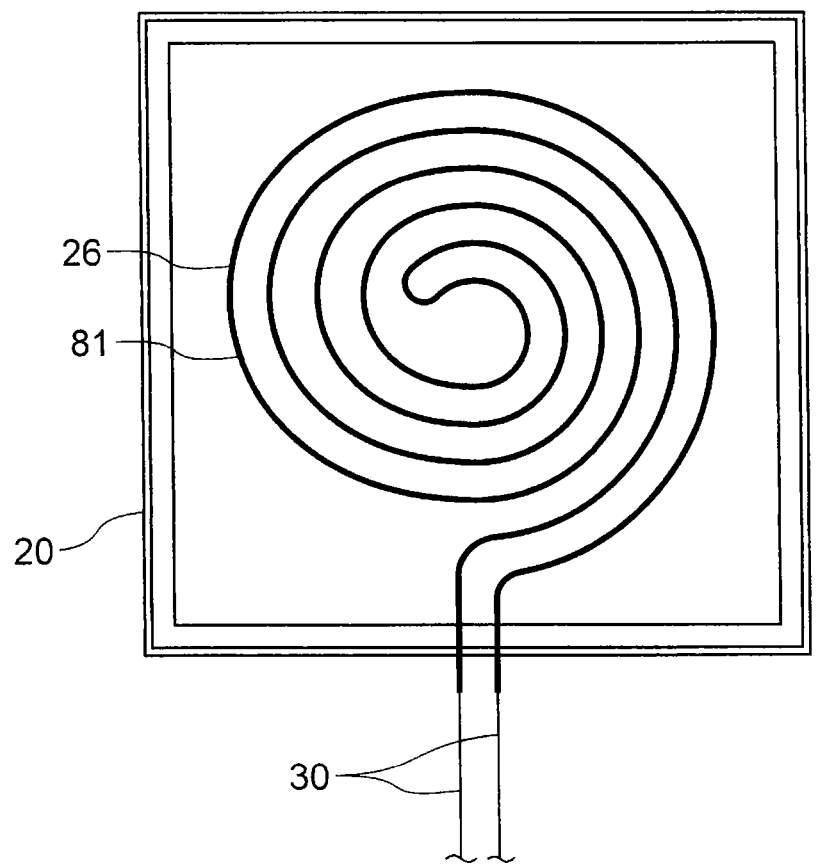
FIG. 11 is a plan view showing a layout of a flat heater according to another embodiment of the present invention.
Figure 12:
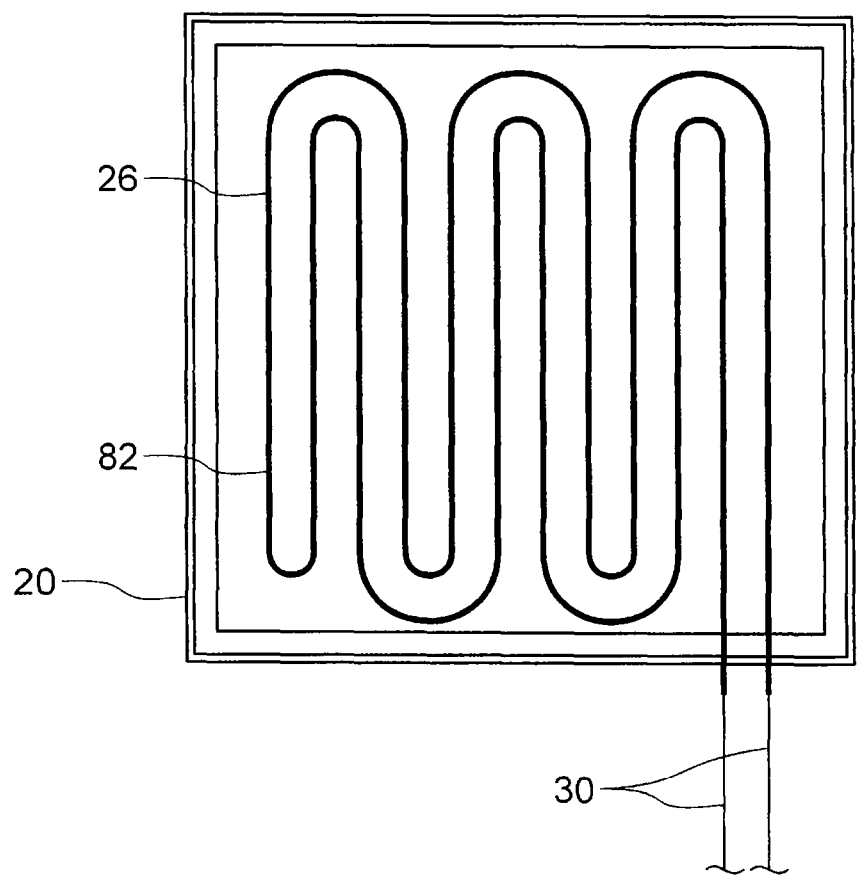
FIG. 12 is a plan view showing a layout of a flat heater according to still another embodiment of the present invention.
Figure 13:
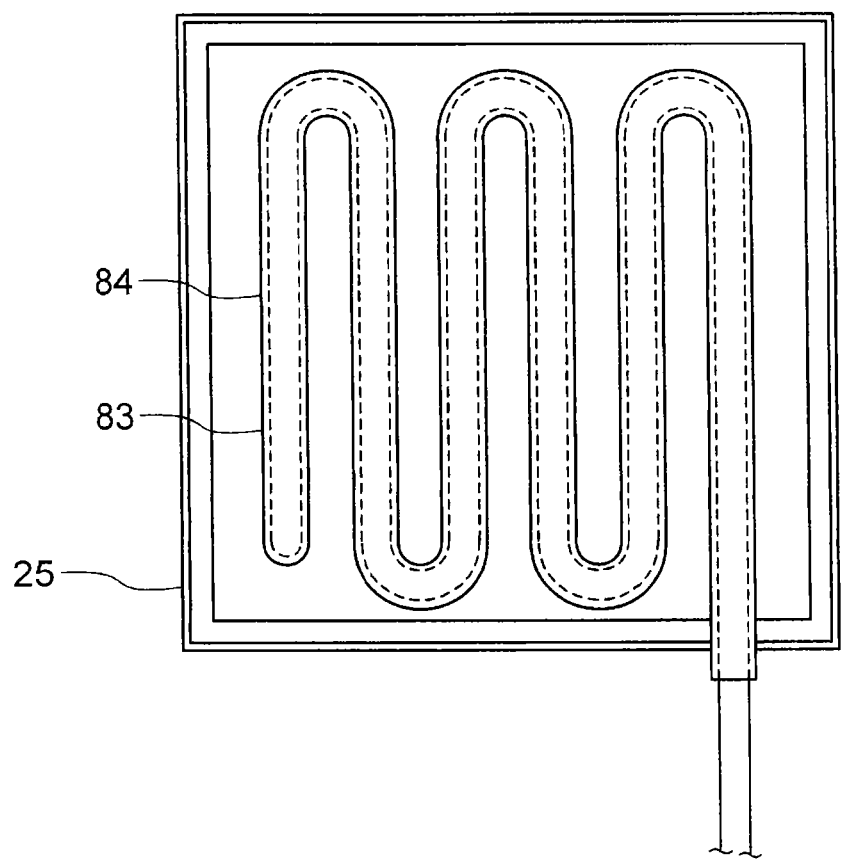
FIG. 13 is a plan view showing a flat heater including a ribbon heater according to still another embodiment of the present invention.

A description is given of other embodiments of the present invention based on FIGS. 11 to 13.

FIG. 11 shows an embodiment of a flat heater 81 formed in a planar pattern by arranging the sheathed heater 26 (see FIGS. 5A and 5B) in a coil form. FIG. 12 shows an embodiment of a flat heater 82 formed in a planar pattern by folding the sheathed heater 26 back and forth. In the flat heaters 81 and 82 shown in FIGS. 11 and 12, the sheathed heater 26 is arranged in a doubled state. Accordingly, the pair of lead wires 30 for electricity conduction are positioned close to each other, and thus wiring of the lead wires 30 for electricity conduction can be easily carried out. In FIG. 13, the linear heater is a ribbon heater 83, which is folded back and forth to form a flat heater 84.

According to at least any one of the embodiments described above, the heater unit includes: the flat heater including a linear heating element arranged in a planar pattern; a first mesh body formed in a mesh pattern using a material with high heat conductivity and is in contact with at least one side of the flat heater; and a second mesh body formed in a mesh pattern using a material having lower heat conductivity than the first mesh body and is placed to face the surface of the first mesh body opposite to the surface of the first mesh body facing the flat heater. Accordingly, the air passing through the heater unit can be uniformly and efficiently heated by the flat heater and first mesh body. Furthermore, the second mesh body can hinder transfer of heat from the heater unit to parts arranged around the heater unit, for example, the filter within the filter unit. The parts placed around the heater unit can be therefore prevented from malfunctioning due to the influence of heat from the heater unit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A heater unit, comprising:
a flat heater including a linear heating element arranged in a planar pattern so that air may pass;
a first mesh body formed in a mesh pattern using a material with high heat conductivity and placed at least on one side of the flat heater to face the flat heater; and
a second mesh body formed in a mesh pattern using a material with lower heat conductivity than that of the first mesh body, and placed on a surface of the first mesh body opposite to the flat heater.

2. The heater unit according to claim 1, wherein
the first mesh body is aluminum mesh made of aluminum,
the second mesh body includes: stainless mesh made of stainless and placed to face a surface of the aluminum mesh opposite to the surface of the aluminum mesh facing the flat heater; and glass fiber mesh made of glass fiber and placed to face a surface of the stainless mesh opposite to the surface of the stainless mesh facing the aluminum mesh.

3. The heater unit according to claim 1, further comprising:
a first temperature measurement unit configured to measure temperature of the flat heater; and
a temperature controller configured to control electrical conduction to the flat heater to adjust a measurement value of the first temperature measurement unit to a setting value.

4. The heater unit according to claim 1, further comprising:
a second temperature measurement unit measuring temperature of the first mesh body; and
at least one of an informing unit configured to inform that a measurement value of the second temperature measurement unit reaches a setting value or above when the measurement value reaches the setting value or above, and an electricity cutoff unit configured to cut off electricity to the flat heater when the measurement value reaches the setting value or above.

5. The heater unit according to claim 1, further comprising a thermostat configured to measure the temperature of the second mesh body and cut off electricity to the flat heater when the measurement value reaches a setting value or above.

6. A fan filter unit, comprising:
a fan unit including a fan configured to blow air;
a filter unit including a filter configured to collect dust in the blown air;

a heater unit provided between the fan unit and the filter unit, wherein
the heater unit includes:
a flat heater including a linear heating element arranged in a planar pattern so that air may pass;
a first mesh body formed in a mesh pattern using a material with high heat conductivity and placed at least on one side of the flat heater to face the flat heater; and
a second mesh body formed in a mesh pattern using a material with lower heat conductivity than that of the first mesh body and placed on a surface of the first mesh body opposite to the flat heater, and
the heater unit is placed between the fan unit and the filter unit in such a manner that a surface of the heater unit on a side where the first and second mesh bodies are provided faces the filter unit.

7. The fan filter unit according to claim 6, wherein
the first mesh body is aluminum mesh made of aluminum, and
the second mesh body includes: stainless mesh made of stainless and placed to face the surface of the aluminum mesh opposite to the surface of the aluminum mesh facing the flat heater; and glass fiber mesh made of glass fiber and placed to face a surface of the stainless mesh opposite to the surface of the stainless mesh facing the aluminum mesh.

8. The fan filter unit according to claim 6, wherein the heater unit includes:
a first temperature measurement unit configured to measure temperature of the flat heater; and
a temperature controller configured to control electrical conduction to the flat heater to adjust a measurement value of the first temperature measurement unit to a setting value.

9. The fan filter unit according to claim 6, wherein the heater unit includes:
a second temperature measurement unit configured to measure temperature of the first mesh body; and
at least one of an informing unit configured to inform that a measurement value of the second temperature measurement unit reaches the setting value or above when the measurement value reaches the setting value or above, and an electricity cutoff unit configured to cut off electricity to the flat heater when the measurement value reaches the setting value or above.

10. The fan filter unit according to claim 6, wherein the heater unit includes:
a thermostat configured to measure the temperature of the second mesh body and cut off electricity to the flat heater when the measurement value reaches a setting value or above.

11. The fan filter unit according to claim 6, further comprising a regulator provided upstream of the heater unit in an air blowing direction of the air blown by the fan and configured to homogenize a flow rate and direction of the air passing through the heater unit.

12. A substrate processing apparatus, comprising:
a casing provided with a mechanism for substrate processing inside, and
a fan filter unit attached to the casing and configured to supply air into the casing, wherein
the fan unit filter includes:
a fan unit including a fan configured to blow air;
a filter unit including a filter configured to collect dust in the blown air;
a heater unit provided between the fan unit and the filter unit, and
the heater unit includes:
a flat heater including a linear heating element arranged in a planar pattern so that air may pass;
a first mesh body formed in a mesh pattern using a material with high heat conductivity and placed at least on one side of the flat heater facing the flat heater; and
a second mesh body formed in a mesh pattern using a material with lower heat conductivity than that of the first mesh body, and placed on a surface of the first mesh body opposite to the flat heater, and
the heater unit is placed between the fan unit and the filter unit in such a manner that a surface of the heater unit on a side where the first and second mesh bodies are provided faces the filter unit.

13. The substrate processing apparatus according to claim 12, wherein
the first mesh body is aluminum mesh made of aluminum,
the second mesh body includes: stainless mesh made of stainless and placed to face a surface of the aluminum mesh that is opposite to the surface of the aluminum mesh facing the flat heater; and glass fiber mesh made of glass fiber and placed to face a surface of the stainless mesh opposite to the surface of the stainless mesh facing the aluminum mesh.

14. The substrate processing apparatus according to claim 12, wherein the heater unit includes:
a first temperature measurement unit configured to measure temperature of the flat heater; and
a temperature controller configured to control electrical conduction to the flat heater to adjust a measurement value of the first temperature measurement unit to a setting value.

15. The substrate processing apparatus according to claim 12, wherein the heater unit includes:
a second temperature measurement unit configured to measure temperature of the first mesh body; and
at least one of an informing unit configured to inform that a measurement value of the second temperature measurement unit reaches a setting value or above when the measurement value reaches the setting value or above, and an electricity cutoff unit configured to cut off electricity to the flat heater when the measurement value reaches the setting value or above.

16. The substrate processing apparatus according to claim 12, wherein the heater unit includes a thermostat configured to measure the temperature of the second mesh body and cut off electricity to the flat heater when the measurement value reaches a setting value or above.

17. The substrate processing apparatus according to claim 12, wherein the fan filter unit includes a regulator provided upstream of the heater unit in an air blowing direction of the air blown by the fan, and configured to homogenize a flow rate and direction of the air passing through the heater unit.

* * * * *